United States Patent [19]

Ho et al.

[11] 4,054,989
[45] Oct. 25, 1977

[54] HIGH RELIABILITY, LOW LEAKAGE, SELF-ALIGNED SILICON GATE FET AND METHOD OF FABRICATING SAME

[75] Inventors: Irving T. Ho; Jacob Riseman, both of Poughkeepsie, N.Y.

[73] Assignee: International Business Machines Corporation, Armonk, N.Y.

[21] Appl. No.: 629,446

[22] Filed: Nov. 6, 1975

Related U.S. Application Data

[62] Division of Ser. No. 521,423, Nov. 6, 1974, Pat. No. 3,943,542.

[51] Int. Cl.² .............................................. B01J 17/00
[52] U.S. Cl. ........................................ 29/571; 29/578
[58] Field of Search ..................... 29/571, 578; 357/59

[56] References Cited

U.S. PATENT DOCUMENTS

| 3,751,722 | 8/1973 | Richman | 357/41 |
| 3,761,327 | 9/1973 | Harlow | 357/59 |

OTHER PUBLICATIONS

IBM Technical Disclosure Bulletin, "Programmable . . . FET", Chiu, vol. 14, No. 11, Apr. 1972, p. 3356.

Primary Examiner—W. Tupman
Attorney, Agent, or Firm—Sughrue, Rothwell, Mion, Zinn and Macpeak

[57] ABSTRACT

An improved FET structure and method of making same is disclosed. The gate structure of the FET includes a phospho-silicate glass as the insulator and polysilicon as the gate conductor. A thin layer of silicon nitride is formed over the polysilicon and selectively etched so as to remain only over gate areas and other areas where it is desired to extend the polysilicon as a conductor. The unmasked polysilicon is oxidized to form the thick oxide surface coating. The disclosure also describes the use of oxide rings and epitaxial layers to reduce parasitic effects between adjacent FET devices in an integrated circuit.

4 Claims, 10 Drawing Figures

HIGH RELIABILITY, LOW LEAKAGE, SELF-ALIGNED SILICON GATE FET AND METHOD OF FABRICATING SAME

This is a division of application Ser. No. 521,423, filed Nov. 6, 1964, now U.S. Pat. No. 3,943,542.

BACKGROUND OF THE INVENTION

The present invention relates to improved FET structures and methods of making same. More particularly, the present invention pertains to a self-aligned silicon gate FET structure and a method of making same.

The physics, performance, and use of FET structures or elements are well known in the semiconductor arts and therefore will not be described herein. A significant amount of low cost, large scale integrated electronics is based upon the metal oxide semiconductor (MOS) field effect transistors (FET). An article describing such devices is, "Silicon-Gate Technology", by Vadasz et al., IEEE Spectrum, October 1969, pp. 28–35. In particular, the article points out the advantages of self-aligned FET's utilizing silicon nitride ($Si_3N_4$) and silicon dioxide ($SiO_2$) as the gate insulator and heavily doped polysilicon as the gate conductor.

The term self-alignment generally means that the gate structure, including the gate insulator and conductor, is formed prior to the drain and source diffusions. This technique permits the gate structure to act as part of the diffusion mask thereby permitting self-alignment of the diffused regions.

The gate insulator is formed over the channel region by placing a silicon wafer into an oxidizing ambient and growing a thin layer of silicon dioxide of about 0.1 micrometers thick. Subsequently, a thin layer of silicon nitride, another insulator, is deposited onto the thin silicon dioxide layer. The gate conductor is formed by next depositing a layer of heavily doped polysilicon on top of the silicon nitride. Masks are subsequently used to etch away the portions of the polysilicon, silicon nitride, and silicon dioxide, which are unwanted. The latter technology is believed to provide some of the advantages over the technology which preceded it. One advantage is reduction in parasitics. Another is a lowering of the threshold voltage. The latter is believed due to the use of silicon nitride with the silicon oxide. The silicon nitride also provides an advantage in connection with the etching of the polysilicon conductor. Most of the chemicals which etch polysilicon will also attack silicon dioxide but will not attack silicon nitride. Consequently, in the absence of the silicon nitride between the thin silicon dioxide layer and the polysilicon layer, removal of the polysilicon in certain regions would also result in removal of the silicon dioxide. In integrated circuits this may not be desirable.

While the structure mentioned above has certain definite advantages, it is not free from all problems. One problem is that the gate insulator formed by the combination of silicon dioxide and silicon nitride causes the threshold voltage of the FET device to drift and therefore become somewhat unstable. The problem of drift is not as prevalent when the silicon nitride is not used. It is known in the prior art to use as the gate insulator a layer of phospho-silicate glass without any silicon nitride to improve the stability and reliability of the gate insulation.

SUMMARY OF THE INVENTION

It is an object of the present invention to provide an improved selfaligned silicon gate FET structure and method of making same.

It is a further object of the present invention to provide an improved FET structure and method permitting greater packing density without the creation of parasitic FET's.

It is a further object of the present invention to provide a method of forming a silicon gate FET which does not require etching of polysilicon material.

These and other objects of the present invention are provided by the method and structure summarized herein and described in greater detail below. The gate structure is formed by growing a thin layer of phospho-silicate glass over the silicon wafer followed by the deposition of heavily doped polysilicon conductor. A thin layer of silicon nitride is formed over the conductor and, by use of conventional masking techniques, is etched to form a desired pattern over the gate areas and also over areas where it is desired to extend the polysilicon conductor. At this point, rather than etching the polysilicon, utilizing the silicon nitride as an etching mask, the entire device is subjected to an oxidizing ambient and the polysilicon which is not masked by the silicon nitride is completely oxidized to form the thick passivating glass for the FET integrated structure. Subsequently, openings are formed in the thick oxide adjacent the gate structure, the drain and source diffusion is carried out, further openings are formed in the regrown oxide over the drain and source diffusions, and the metallization is carried out. Additionally, in order to reduce the formation of parasitic FET's in an integrated structure with close packing density, isolating oxide rings are formed prior to the FET formation. The FET's are subsequently formed into the islands thus created. The oxide isolation rings (any surrounding geometry including a square) also serve as boundaries for the drain and source diffusion thereby permitting the use of cruder masks in the formation of the drain and source diffusions. Additionally, the FET's may be formed in an epitaxial layer grown over the substrate. According to the latter feature, the substrate will have a higher p-type concentration than the epitaxial layer. The lower concentration epitaxial layer will result in a lower threshold FET device whereas the higher concentration substrate, in combination with the surrounding oxide ring, will further prevent leakage and the formation of parasitic FET elements.

BRIEF DECRIPTION OF THE DRAWINGS

DETAILED DESCRIPTION OF THE PREFERRED EMBODIMENT

Figure 1:
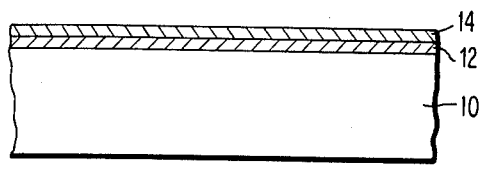
FIGS. 1 through 7 are cross-sectional side views of an FET element during various stages of the preferred method of forming the selfaligned silicon gate FET.

The invention will be described in connection with the formation of an n-type channel FET. However, it will be understood by any one of ordinary skill in the art that except for a variation in type conductivity, and dopant materials, the process and resulting structure will be equally applicable to a p-type channel FET. Referring to FIG. 1, a wafer 10 of p-type monocrystalline silicon material is prepared for the formation of surrounding oxide isolation barriers. The isolation barriers are illustrated at 16 in FIG. 2 and such barriers may be formed by techniques well known in the art. Oxide isolation barriers are known for use in bipolar integrated circuitry but heretofore have not been used in FET integrated circuitry because of the normally inherent self-isolation feature of MOSFET devices. The desirability of using the oxide isolation barriers will be explained hereafter in connection with FIGS. 8, 9 and 10.

A preferred method for forming the isolation barriers will now be described. Referring again to FIG. 1, the silicon wafer 10 is subjected to an oxidizing ambient to form a layer of silicon dioxide 12 having a thickness in the range of 100 - 1,000 A. Subsequently, a layer of silicon nitride 14 having a thickness in the range of 500 - 1,000 A is formed on top of the silicon dioxide. The combined layers 12 and 14 indicated in FIG. 1 serve only as a mask for etching of the silicon wafer 10. The thickness ranges described above are not critical. Furthermore, silicon dioxide alone or silicon nitride alone could be used but the combination is preferred for the following reason. When silicon dioxide is used as a mask to permit etching of silicon, the chemical which etches the silicon also tends to attack the silicon dioxide. Consequently, it is preferable not to use silicon dioxide alone. Silicon nitride alone could be used but it is believed that the formation of a layer of silicon nitride directly onto the silicon wafer will harm the silicon wafer in the surface area.

Figure 2:
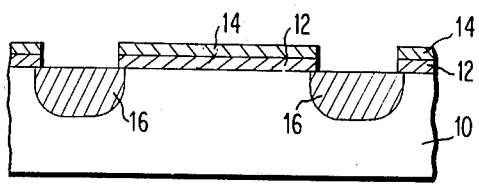
Figure 3:
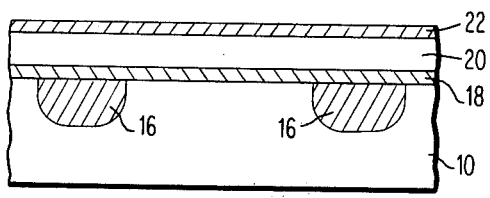

Referring to FIG. 2, a mask is used to remove areas of the silicon nitride and subsequently also to remove areas of the silicon dioxide in regions where it is desired to form surrounding oxide barriers 16. Preferable materials for etching silicon nitride and silicon dioxide are hot phosphoric acid and a buffer etch, respectively. The so-called buffer etch is a well known mixture of hydrofluoric acid and ammonium hydroxide. The oxide region 16 is formed by the well known etch and regrowth technique. That is, a region of the silicon is etched through the openings formed in the silicon nitride and silicon dioxide. A preferable solution for etching silicon is a mixture of hydrofluoric and nitric acid. The etched regions are then subjected to an oxidizing ambient thereby resulting in the oxide region 16 as shown having a surface which is substantially flush with the silicon surface. It will be noted that the flushness is not a critical requirement. Next, the silicon nitride layer 14 is removed followed by removal of the silicon dioxide layer 12. Subsequently, a thin silicon dioxide layer 18 is re-grown over the entire surface. The purpose of re-growing the silicon dioxide layer 18 as opposed to utilizing the oxide layer 12, is due to the fact that the use of phosphoric acid to remove the silicon nitride layer may contaminate the silicon dioxide layer 12. Inasmuch as it is desirable to provide a very clean oxide layer for the gate insulator, the layer 12, which may be contaminated, is removed and a new layer 18, as shown in FIG. 3 is re-grown. The oxide layer 18 is referred to as the thin oxide because it has a thickness (or more properly a thinness) which is suitable for use as the insulator of the FET gate structure. Suitable dimensions of a gate insulator are well known in the art. As an example herein, the gate thickness may be assumed to be approximately 500 A. It will be noted that the term thin oxide is known in the art and distinguishes the oxide used for the gate insulator from the so-called thick oxide which serves the normal passivation function on the integrated circuit.

The oxide layer 18 is preferably a phospho-silicate glass which is well known for the purpose used herein and which may be formed, for example, by growing a layer of silicon dioxide at about 900° to 950° centigrade to a thickness of 350°A and subsequently introducing phosphorous oxychloride into the gas stream to grow the layer for another 150 A. Many variations of the latter method are well known in the art and would also be suitable for the oxide insulating layer. Next, heavily doped polysilicon may be deposited onto layer 18, in the manner described in the Vadasz article mentioned above to form the conductor layer 20. The polysilicon will serve as the gate electrode, and hence the name "silicon-gate FET".

At this point in the process the quality of the thin oxide layer 18 can be tested by the method of self-healing breakdown. This method is described in, "Electricl Breakdown in Solids", by Klein, Advances in Electronics and Electron Physics, Vol. 26, pp. 309–424, Copyright 1969, Academic Press Inc., New York.

Figure 4:
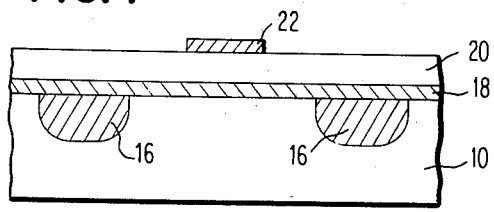
Figure 5:
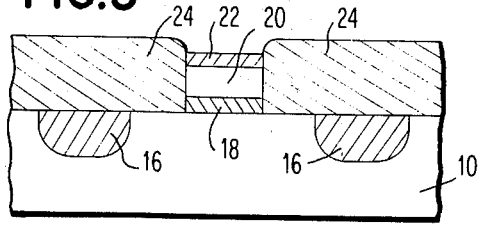
Figure 6:
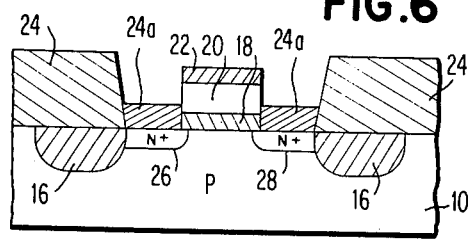

Using another mask and a hot phosphoric acid etching solution, portions of layer 22 are removed leaving the silicon nitride layer 22 only in those areas where the gate is to be formed and where the polysilicon conductor is desired. This is indicated diagrammatically in FIG. 4. The structure is then subjected to an oxidizing ambient for a sufficient period of time to completely oxidize into a thick oxide covering, all of the polysilicon layer except for that portion covered by the silicon nitride mask 22. The resulting structure is illustrated in FIG. 5 wherein the oxidized polysilicon is indicated by numeral 24. The gate region is shown in FIG. 5 as comprising the thin oxide 18, the gate electrode 20, and the masking nitride layer 22. Holes are subsequently opened in the thick oxide 24 between the gate structure and the surrounding barrier oxide 16 for formation of the source and drain diffusions. Due to the pre-formation of the gate structure and the existence of the surrounding ring 16, the masks used for opening the holes in the oxide and subsequently diffusing the drain and source regions may be relatively crude. In the example described, arsenic is diffused through the openings in the thick oxide to form the source and drain regions 26 and 28, respectively. During diffusion, there is oxide re-growth over the diffusion regions as indicated by 24a in FIG. 6. As shown in FIG. 6, some of the dimensions which may be typical for the fabricated device are: depth of region 16 approximately 1 micrometer; depth of drain and source diffusions approximately 0.5 micrometers; thickness of thin oxide 18 approximately 0.1 micrometer; thickness of silicon layer 22 approximately 0.02 micrometers.

Figure 7:
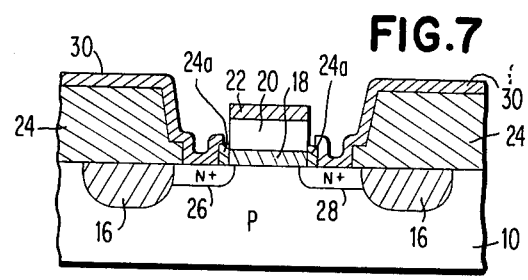

The source and drain metallization is subsequently formed, as indicated in FIG. 7, by reopening holes in the re-grown oxide region 24a, evaporating aluminum over the entire surface, and utilizing a metallization mask to remove those portions of the aluminum layer which are not desired for conductors, resulting in the structure indicated. The source and drain conductors are indicated by numeral 30 in FIG. 7.

Portions of the silicon nitride covering 22 are removed where it is desired to make contact with the polysilicon conductor 20. Those points may be at points on the surface which are not over the FET gate region.

On the other hand, the silicon nitride layer 22 could be completely removed.

Figure 8:
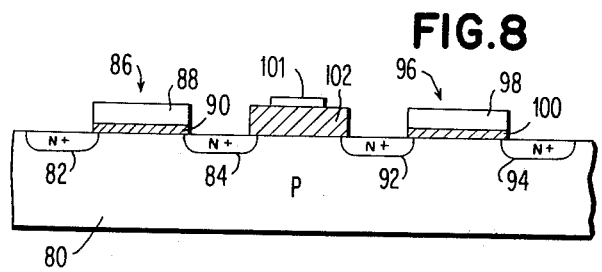
FIG. 8 is a cross-sectional side view of an FET integrated circuit illustrating the problem of parasitic FET elements.

The isolating oxide ring 16 serves two functions. One is to provide a control barrier for determining the edge of the source and drain diffusions thereby permitting the use of crude masks. The second is to enable increased packing density of field effect devices in an integrated structure. The problem of parasitic field effect transistors which can be caused by high packing density is illustrated in FIG. 8 wherein two field effect transistors in a single integrated circuit are shown. In FIG. 8, the metallization and parts of the thick oxide are not shown, but it will be apparent that such parts are present in a completed device. Only so much as is necessary to explain the problem of parasitic field effect transistors is illustrated. The first field effect transistor comprises source and drain diffusions 82 and 84, and gate structure 86. The gate structure 86 comprises silicon gate 88 and oxide insulator 90. Conduction between the source and drain is caused in the well known manner by applying a voltage which creates an n-type channel between the source and drain diffusions 82 and 84. A second field effect transistor, operating in the same manner, comprises source and drain diffusions 92 and 94, and gate structure 96. The latter comprises a silicon gate 98 and an oxide insulator 100. Normally, there will be isolation between the two field effect transistors illustrated because of the p-n junctions formed between the substrate 80 and the $n+$ diffused regions 84 and 92. However, as improved techniques lead to greater packing densities, the following situation can result. The thick oxide 102 covers the inter-FET region between the drain 84 of the first FET and the source 92 of the second FET. Also, as is quite conventional the thick oxide 102 may have part of a conductor 101 thereon. If the oxide 102 is not sufficiently thick and if the diffusions 84 and 92 are not sufficiently far apart, a voltage of the proper magnitude applied to conductor 101 will cause an n-type channel between the drain 84 and the source 92 causing a parasitic FET effect those two diffusions. Hence, the need for the oxide isolation ring adjacent FET devices. The oxide isolation ring is illustrated in FIGS. 2 through 7 and the method for forming same has previously been described.

Figure 9:
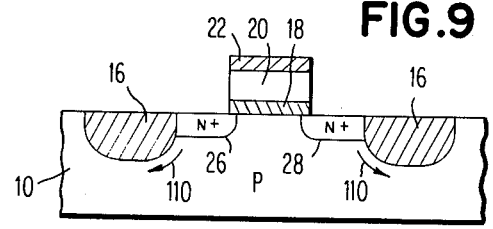
FIGS. 9 and 10 are cross-sectional side views of FET elements illustrating the problem of leakage currents and the solution to that problem, respectively.
Figure 10:
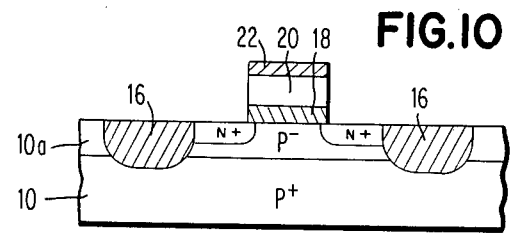

In some cases it may be desirable to include an additional feature to prevent the formation of parasitic FET's. This additional feature is an epitaxial region and is explained in connection with FIGS. 9 and 10. FIG. 9 shows the structure similar to that illustrated in FIG. 7 except that the thick oxide region and the metallization are not illustrated. As pointed out above, the oxide ring 16 is intended to provide isolation between adjacent field effect transistors. However, in some cases the oxide ring may not be sufficient or satisfactory to provide the necessary isolation. Typically, in field effect transistors there are competing requirements which one considers in deciding the optimum concentration of the p-type substrate. Very broadly, the competing requirements are as follows. First, it is desired to have a relatively low concentration of p-type impurities in semiconductor region 10 to thereby result in an FET device with a low threshold voltage. Conversely, it is desirable to have a high concentration of dopant in the p-type layer 10 in order to prevent self-inversion in the area of the silicon dioxide. As is well known, silicon dioxide in contact with p-type silicon tends to type convert the p-type silicon in the surface region. This, if the p-type layer 10 has relatively low concentration of p-type impurities, e.g., $10^{15} - 10^{16}$ dopant atoms per cubic centimeter, the silicon region in contact with ring 16 will tend to type convert thereby creating an n-type channel around the bottom of the ring 16. Although the latter problem can be solved by increasing the concentration of the p-type dopant to a range of $10^{17} - 10^{18}$ atoms of dopant per cubic centimeter, such a high concentration will result in a field effect transistor with a relatively high threshold voltage. In essence, the best of both worlds can be achieved by forming the field effect transistor in an epitaxially grown layer having a p-type concentration which is significantly below the p-type concentration of the substrate, and extending the isolation ring 16 through the epitaxial layer into the substrate. The latter structure is illustrated in FIG. 10 and differs from FIG. 9 only in the existence of the epitaxially grown $p-$ layer 10a. In this case, the substrate 10 may be a $p+$ substrate having a concentration of $10^{17} - 10^{18}$ dopant atoms per cubic centimeter and the epitaxial layer 10a may be a $p-$ layer having a concentration of $10^{15} - 10^{16}$ dopant atoms per cubic centimeter. Thus, even if the concentration of the $p-$ layer is so relatively low that an n-channel will form adjacent the oxide ring 16, it can be seen that the n-channel will not extend under the ring 16 because of the high concentration of p-type dopants in the layer 10.

We claim:

1. A method of fabricating a field effect transistor comprising the steps of:
  a. forming a thin layer of oxide on a wafer of monocrystalline silicon,
  b. depositing a layer of conductive polycrystalline silicon on said thin layer of oxide,
  c. forming a layer of silicon nitride on said polycrystalline layer,
  d. within at least the area of said wafer where said field effect transistor is to be fabricated, removing portions of said silicon nitride layer to form a silicon nitride mask over said polysilicon layer, said mask in said area covering only the region to be the gate structure of said field effect transistor,
  e. oxidizing all said polysilicon layer not covered by said silicon nitride mask to form a thick oxide layer thicker than said polysilicon layer,
  f. opening holes within said thick oxide layer on opposite sides of said gate structure,
  g. introducing impurities into the surface of said monocrystalline silicon layer exposed by said openings to form the drain and source regions of said field effect transistor, and
  h. forming conductive contacts to said source and drain regions.

2. The method as claimed in claim 1 further comprising, prior to the formation of said thin layer, the steps of etching the surface of said monocrystalline area to form an etched surface ring surrounding a region of said monocrystalline silicon, and oxidizing said etched surface ring to form an oxide ring around said region, said oxide ring being substantially flush with said monocrystalline surface, said gate structure being formed on the monocrystalline surface within said region, and said drain and source diffused regions being formed within said region.

3. The method as claimed in claim 2 further comprising, prior to the formation of said oxide ring, the steps of, epitaxially growing a layer of single crystal silicon onto a substrate of single crystal silicon, said epitaxial and substrate layers being of the same type conductivity and said epitaxial layer being significantly more resistive than said substrate layer, wherein said epitaxial and substrate layer together comprise said wafer of monocrystalline silicon and wherein said oxide ring extends all the way through said epitaxial layer into said substrate.

4. A method of fabricating a field effect transistor comprising the steps of:
   a. forming a thin layer of oxide on a wafer of monocrystalline silicon,
   b. depositing a layer of conductive polycrystalline silicon on said thin layer of oxide,
   c. forming a layer of silicon nitride on said polycrystalline layer,
   d. within at least the area of said wafer where said field effect transistor is to be fabricated, removing portions of said silicon nitride layer to form a silicon nitride mas over said polysilicon layer, said mask in said area covering only the region to be the gate structure of said field effect transistor,
   e. oxidizing all said polysilicon layer not covered by said silicon nitride mask to form a thick oxide layer thicker than said polysilicon layer,
   g. opening holes within said thick oxide layer on opposite side of said gate structure, and,
   g. introducing imputirites into the surface of said monocrystalline silicon layer exposed by said openings.

* * * * *

UNITED STATES PATENT AND TRADEMARK OFFICE
CERTIFICATE OF CORRECTION

PATENT NO. : 4,054,989
DATED : October 25, 1977
INVENTOR(S) : Irving T. HO et al It is certified that error appears in the above-identified patent and that said Letters Patent are hereby corrected as shown below:

IN THE SPECIFICATION:

Column 2, line 4 - after "self" insert -- - --
            line 55 - after "self" insert -- - --
Column 4, line 9 - delete "350° A" insert -- 350 A --
            line 22 - delete "Electricl" insert -- Electrical --
            line 56 - after "silicon" insert -- nitride --
Column 5, line 40 - after "effect" insert -- between --
            line 41 - after "ring" insert -- between --
            line 67 - delete "This," insert -- Thus, --

IN THE CLAIMS:

Column 8, line 10 - delete "g." insert -- f. --
            line 11 - delete "side" insert -- sides --

Signed and Sealed this

Ninth Day of May 1978

[SEAL]

Attest:

RUTH C. MASON
Attesting Officer

LUTRELLE F. PARKER
Acting Commissioner of Patents and Trademarks